US005500279A

United States Patent [19]

Walter et al.

[11] Patent Number: 5,500,279

[45] Date of Patent: Mar. 19, 1996

[54] LAMINATED METAL STRUCTURE AND METOD OF MAKING SAME

[75] Inventors: Lee Walter, San Diego; Steven J. Adamson, Poway, both of Calif.

[73] Assignee: Eastman Kodak Company, Rochester, N.Y.

[21] Appl. No.: 297,194

[22] Filed: Aug. 26, 1994

[51] Int. Cl.$^6$ .......... B32B 7/02

[52] U.S. Cl. .......... 428/213; 428/414; 428/469; 428/472; 428/473.5; 428/698; 428/702

[58] Field of Search .......... 428/469, 472, 428/472.2, 699, 698, 213, 414, 415, 473.5, 446, 451; 156/630, 629, 656, 634; 347/141, 147; 346/139 C; 437/190, 192

[56] References Cited

U.S. PATENT DOCUMENTS

| | | | |
|---|---|---|---|
| 3,613,230 | 10/1971 | Griff | 29/828 |
| 4,112,436 | 9/1978 | Cone | 346/140 R |
| 4,544,441 | 10/1985 | Hartmann | 156/634 |
| 4,613,549 | 9/1986 | Tanaka | 428/469 |
| 4,615,945 | 10/1986 | Iida | 428/335 |
| 4,755,257 | 7/1988 | Yamamoto | 156/631 |
| 4,806,395 | 2/1989 | Walsh | 427/444 |
| 4,882,237 | 11/1989 | Koyama | 428/699 |
| 4,888,079 | 12/1989 | Pike | 156/319 |
| 4,983,250 | 1/1991 | Pan | 156/628 |
| 4,997,520 | 3/1991 | Jucha | 156/643 |
| 5,002,818 | 3/1991 | Licari | 428/209 |
| 5,057,186 | 10/1991 | Chew et al. | 156/643 |
| 5,086,011 | 2/1992 | Shiota | 437/61 |
| 5,165,282 | 11/1992 | Nakamura et al. | 73/727 |
| 5,200,028 | 4/1993 | Tatsumi | 156/656 |
| 5,225,040 | 7/1993 | Rohner | 156/652 |
| 5,227,009 | 7/1993 | Sunakawa et al. | 156/634 |

*Primary Examiner*—Ellis P. Robinson
*Assistant Examiner*—Leonidas J. Jones, III
*Attorney, Agent, or Firm*—William F. Noval

[57] ABSTRACT

The laminate of the invention is provided with an etch stop to protect the laminate's adhesive layer. The etch stop also circumvents any etching interference due to degradation products which would arise from breakdown of the adhesive layer. The etch stop is a protective thin film in the form of a metal oxide, metal nitride, metal oxynitride, metal carbide or metal oxycarbide coating deposited on the back side of the metal sheet prior to lamination onto the substrate by means of an organic adhesive. The thin etch stop film is in the form of a blanket coating to assure adhesion to the metal surface and to the adhesive. It may be deposited onto the metal sheet by standard vacuum deposition techniques such as DC and magnetron sputtering, thermal and E-beam evaporation, chemical vapor deposition, and plasma enhanced chemical vapor deposition methods. The thin film thickness is flexible, and can range in thickness from tenths of angstroms to microns.

1 Claim, 2 Drawing Sheets

10

18

14

12

LAMINATED METAL STRUCTURE AND METOD OF MAKING SAME

BACKGROUND OF THE INVENTION

1. Field of the Invention

This invention relates to a laminated metal structure, and in particular to a metal laminate having an etch stop to prevent undercutting of the adhesive of the laminated structure.

2. Description Relative to the Prior Art

Mechanical processing of patterned thick laminated metal sheets is a viable approach in fabricating devices such as resistive ribbon and thermal print heads when the dimensions of the patterned device is on the order of mils. Referring to FIG. 1, the method involves laminating a thick metal sheet (10) on the order of 1 to several mils thick onto a carrier substrate (12) such as alumina ($Al_2O_3$) or Kapton, a pdyimide based plastic, and then patterning the metal sheet by photolithographic or other means. The metal sheet is conventionally laminated using a variety of organic adhesives (14) compatible with the substrate. Cutting means such as grinding, gouging or sawing then allows the laminated structure to be diced out along the patterned outline to obtain the patterned part without fear of delaminating the structure. However, as the resolution of the patterned device features is increased into the micron range, such mechanical processing becomes impossible.

For high resolution patterns, alternate processing means have been explored with vacuum processing the method of choice. Vacuum etching of the metal sheet is an attractive method of metal removal to leave the patterned part adherent to the substrate. The most prominent of these methods is Reactive Ion Etching (RIE) which is based on glow discharge plasma techniques.

The vacuum method focuses on masking or photomasking a pattern on the metal sheet with subsequent gas phase chemical etching to remove the exposed metal. The RIE process is tailored to etch the specific metal of choice by adjusting the chemical system and/or the RIE etching conditions. The majority of chemical systems rely on generating reactive species such as fluorine (F), chlorine (Cl), and/or oxygen (O) in the form of ions, radicals and neutrals. These species are present individually, in combination or conjunction with other chemical fragments within a glow discharge. These species can be generated by using reactant gases such as perfluoromethane ($CF_4$), perfluoroethane ($C_2F_6$), carbon tetrachloride ($CCl_4$), chlorine ($Cl_2$), oxygen ($O_2$), boron trichloride ($BCl_3$), and sulfur hexafluoride ($SF_6$).

The majority of RIE processes are designed to provide an etch stop. The etch stop provides an end point of thee etching process by providing a surface that can not be etched by reactive species or a surface where the etch rate of the surface is several orders of magnitude smaller than the selective material being etched.

The critical problem that exists with RIE methods when used with laminated structures is related to the compatibility between the laminate adhesive and the reactive species generated in the RIE process. The laminate adhesive system must have the following properties: a) be impervious to chemical breakdown in the plasma, b) the adhesive can not interfere with the selected metal etch process, and c) the adhesive must survive the local temperature effects during the etching process. The reactive species generated by the reactants listed above, chemically react with and continuously degrade adhesives containing Organics. The degradation products subsequently interfere with the RIE etching process of the metal layer by generating unfavorable polymeric by-products that redeposit on the surface of the metal layer or alter the gas phase chemistry in a manner that the etch selectivity is not in favor of the metal layer. The majority of such adhesives can be readily attacked by fluorine, chlorine and oxygen containing species with the activated plasma. RIE attack of the laminate adhesive results in dramatic undercutting and severe delamination of the metal from the surface of the substrate. Referring to FIG. 2, patterned metal parts 16, RIE processed from a metal sheet (10, FIG. 1) adhere to a substrate 12 by means of adhesive 14. It will be noted that the adhesive 14 has been undercut at the patterned pieces 16, and that because of the undercutting the metal pieces 16 are severely delaminated from the substrate 12.

The present invention relates to a laminate suitable for RIE etching using an adhesive containing organics without the problem of delamination due to destruction of the adhesive, and a method for making and using such a laminate.

SUMMARY OF THE INVENTION

The laminate of the invention is provided with an etch stop to protect the laminate's adhesive layer. The etch stop also circumvents any etching interference due to degradation products which would arise from breakdown of the adhesive layer. The etch stop is a protective thin film in the form of a metal oxide, metal nitride, metal oxynitride, metal carbide or metal oxycarbide coating deposited on the back side of the metal sheet prior to lamination onto the substrate by means of an organic adhesive. The thin etch stop film is in the form of a blanket coating to assure adhesion to the metal surface and to the adhesive. It may be deposited onto the metal sheet by standard vacuum deposition techniques such as DC and magnetron sputtering, thermal and E-beam evaporation, chemical vapor deposition, and plasma enhanced chemical vapor deposition methods. The thin film thickness is flexible, and can range in thickness from tens of angstroms to microns.

BRIEF DESCRIPTION OF THE DRAWINGS

The invention will be described with respect to the figures of which.

DETAILED DESCRIPTION OF THE PREFERRED EMBODIMENTS

Figure 1:
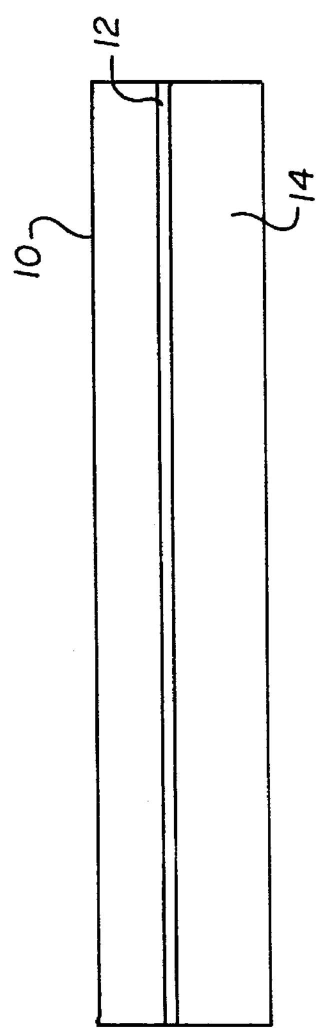
FIG. 1 is a drawing of a metal laminate known in the prior art.
Figure 2:
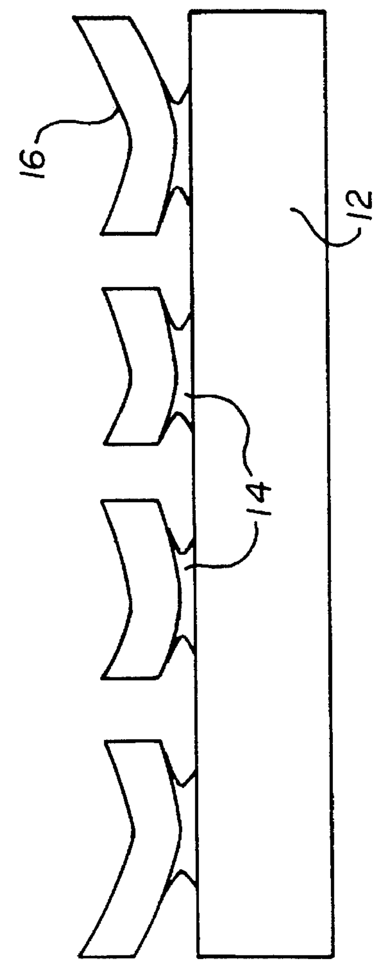
FIG. 2 illustrates delamination that occurs after RIE on laminates of the prior art.
Figure 3:
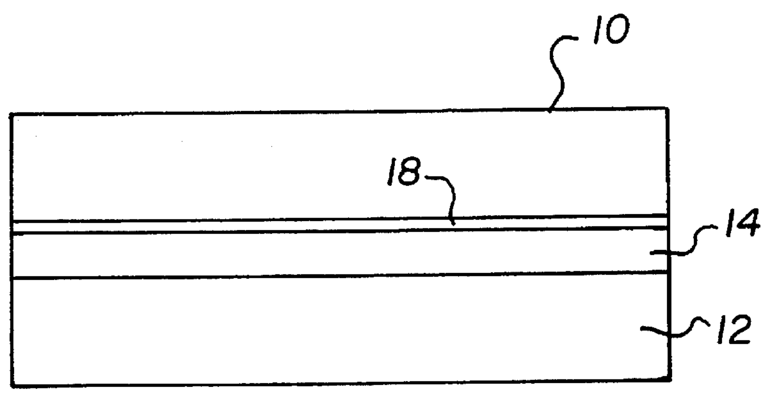
FIG. 3 is a drawing of a metal laminate in accordance with the present invention.

Referring to FIG. 3, an etch stop 18 of alumina ($Al_2O_3$) is sputter deposited on the back surface of a metal sheet 10. By means of an adhesive 14 the alumina coated surface of the metal sheet 10' is laminated to the substrate 12. Alumina ($Al_2O_3$) is the preferred etch stop material for fluorine based etch chemistries.

EXAMPLE

Thin films of approximately 2 micron thickness were deposited onto two inch diameter 1 mil thick tungsten (W) sheets, and subsequently laminated onto three inch diameter silicon substrates using two different organic adhesives; TORR SEAL, a bisphenol A epichlorohydrin epoxy with magnesium silicate hydrate, manufactured by Varian Associates, Lexington, Mass. and ABLE BOND, a bisphenol A epoxy amine, manufactured by Ablestick Corp., Los Angeles, Calif. A photoresist pattern having a resolution of 600 lines per mm was then laid down on the tungsten sheet. The structure was reactively ion etched in a standard commercial RF parallel plate RIE in a fluorine etch environment. The reactant gases used were composed of perfluoroethane and sulfur hexafluoride.

Figure 4:
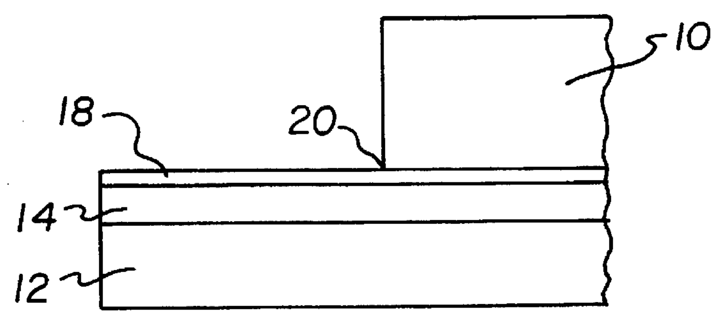
FIG. 4 is a drawing showing prevention of delamination in accordance with the present invention.

The laminated tungsten sheets with the etch stop were successfully etched for both the Torr Seal and Able Bond adhesives. The etch profile illustrated in FIG. 4 shows that the metal 10 was not undercut at the junction 20 of the metal 10 and etch stop 18. Also the adhesive 14 was fully protected by the etch stop 18.

The invention has been described in detail in relation to preferred embodiments thereof, but it will be understood that modifications and variations can be effected within the spirit and scope of the invention.

What is claimed is:

1. A laminate adapted for etching of a pattern thereon, said laminate consisting of:

a) a thick metal sheet of thickness from 1 to several mils, said thick metal sheet having a first surface and a second surface, wherein said first surface is for receiving said pattern thereon, b) an etch stop coating selected from the group consisting of a metal oxide, metal nitride, metal oxynitride, metal carbide, metal oxycarbide, and $Al_2O_3$, said etch stop coating adherent to said second surface of said sheet, c) a substrate, and d) an organic adhesive layer bonding said substrate to said etch stop coating wherein said etch stop coating has an effective thickness to protect the said organic adhesive during etching.

* * * * *